United States Patent
Papamichail

(10) Patent No.: US 10,644,655 B2
(45) Date of Patent: May 5, 2020

(54) ELECTRONIC BIASING CIRCUIT FOR CONSTANT TRANSCONDUCTANCE

(71) Applicant: Dialog Semiconductor B.V., 's-Hertogenbosch (NL)

(72) Inventor: Michail Papamichail, Den Bosch (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 14/733,102

(22) Filed: Jun. 8, 2015

(65) Prior Publication Data

US 2015/0270812 A1    Sep. 24, 2015

Related U.S. Application Data

(63) Continuation of application No. 13/974,320, filed on Aug. 23, 2013, now Pat. No. 9,083,287.

(30) Foreign Application Priority Data

Mar. 25, 2013    (EP) .................................... 13160860

(51) Int. Cl.
*H03F 3/04*    (2006.01)
*H03F 1/30*    (2006.01)
(Continued)

(52) U.S. Cl.
CPC ............. *H03F 1/301* (2013.01); *G05F 3/24* (2013.01); *H03F 1/223* (2013.01); *H03F 3/16* (2013.01);
(Continued)

(58) Field of Classification Search
CPC ....................................................... H03F 3/04
(Continued)

(56) References Cited

U.S. PATENT DOCUMENTS 3,983,502 A * 9/1976 Wheatley, Jr. .......... H03F 1/305
330/146
6,124,705 A 9/2000 Kwong
(Continued)

FOREIGN PATENT DOCUMENTS

DE        102004042354        3/2006
EP    13 160 860.6-1810        9/2015
(Continued)

OTHER PUBLICATIONS

"Current mirror questions", EDAboard electronic discussion forum, Nov. 17, 2009, Retrieved from the internet: URL:http://www.edaboard.com/thread/62984.htm, retrieved on Sep. 4, 2013.
(Continued)

*Primary Examiner* — Henry Choe
(74) *Attorney, Agent, or Firm* — Saile Ackerman LLC; Stephen B. Ackerman

(57) ABSTRACT

An electronic biasing circuit provides a DC bias voltage to a circuit to be biased. The biasing circuit has a first transistor and a second transistor. A gate of the first transistor is connected to a gate of the second transistor and supplies the DC bias voltage. A source of the first transistor is connected to a supply reference voltage. A source of the second transistor is connected to the supply reference voltage via a resistor element. The currents flowing through the first and second transistor are forced to be equal. A third transistor is connected in series with the first transistor and a fourth transistor is connected in series with the second transistor. Currents flowing through the third and fourth transistors are forced to be equal.

28 Claims, 6 Drawing Sheets

(51) Int. Cl.
    *H03F 3/16*     (2006.01)
    *G05F 3/24*     (2006.01)
    *H03F 1/22*     (2006.01)

(52) U.S. Cl.
    CPC .... *H03F 2200/18* (2013.01); *H03F 2200/447* (2013.01); *H03F 2200/456* (2013.01)

(58) Field of Classification Search
    USPC .................................. 330/288; 323/315, 316
    See application file for complete search history.

(56) References Cited

U.S. PATENT DOCUMENTS

| | | | |
|---|---|---|---|
| 6,194,886 B1 | 2/2001 | D'Aquino et al. | |
| 7,154,923 B2* | 12/2006 | Kucharski | H01S 5/042 |
| | | | 327/108 |
| 7,443,237 B1* | 10/2008 | Liu | H03F 3/45192 |
| | | | 330/253 |
| 7,679,445 B2* | 3/2010 | Lawas | H03F 1/14 |
| | | | 330/253 |
| 2007/0229158 A1 | 10/2007 | Mojarradi et al. | |
| 2009/0108941 A1 | 4/2009 | Oishi | |
| 2010/0237950 A1 | 9/2010 | Cao | |

FOREIGN PATENT DOCUMENTS

| | | |
|---|---|---|
| JP | S 5671313 | 6/1981 |
| JP | 2007 148530 | 6/2007 |
| WO | WO2013140852 | 9/2013 |

OTHER PUBLICATIONS

Design of Analog CMOS Integrated Circuits, McGraw-Hill International Edition, Copyright 2001, Electrical Engineering Series, by Behzad Razavi, pp. 390-393.

* cited by examiner

ELECTRONIC BIASING CIRCUIT FOR CONSTANT TRANSCONDUCTANCE

TECHNICAL FIELD

The present invention relates to an electronic circuit with biasing topology for constant transconductance.

BACKGROUND ART

The performance of amplifiers is heavily affected by variations in Process, Voltage, and Temperature (PVT). In CMOS technologies, the so-called constant-gm circuit [1] (gm=transconductance), illustrated in FIG. 1, is traditionally employed to partly compensate those variations. FIG. 1 shows an electronic biasing circuit with a current mirror CM1, a transistor pair TP1 and a resistor element Rb. The current mirror CM1 and transistor pair TP1 in FIG. 1 are implemented with MOSFETs.

The current mirror CM1 comprises two PMOS transistors M3, M4 connected in a well known current mirror arrangement, such that a current I1 flowing from a source to a drain of transistor M3 is substantially equal to a current I2 flowing from a source to a drain of transistor M4. Here, it is observed that the term "substantially" means "as close as possible to" within the error introduced by the finite output resistance of the MOSFETs, and within any possible manufacturing tolerances. This applies throughout the entire specification.

The gate of transistor M3 is connected to its drain. So, transistor M3 is diode connected. The sources of transistors M3, M4 are connected together to a power supply voltage $V_s$.

The transistor pair TP1 comprises two NMOS transistors M1, M2. The gate of transistor M1 is connected to its drain. So, transistor M1 is diode connected. The gate and drain of transistor M1 are connected to the drain of transistor M4 of current mirror CM1. The source of transistor M1 is connected to ground voltage $V_{GR}$, or, worded more generally, a supply reference voltage. The current through transistor M1 is indicated by I2'.

The gate of transistor M2 is connected to the gate of transistor M1. The source of transistor M2 is connected to one side of a resistor element Rb whereas the other side of the resistor element Rb is connected to ground voltage $V_{GR}$. The drain of transistor M2 is connected to the drain of transistor M3. The current through transistor M2 is indicated by I1'.

Ideally, in the circuit of FIG. 1, because of the presence of current mirror CM1, the following relation should apply:

$$I1=I2=I1'=I2'$$

Transistors M1, M2, and resistor element Rb define the currents I1, I2, I1', I2' of this circuit in the non-trivial (non-zero) solution (a startup circuit -not shown in FIG. 1—is typically forcing the non-trivial solution to prevail). First order analysis with the well-known quadratic MOSFET model [1] shows that the transconductance of the MOSFETs is inversely proportional to the resistance Rb. The circuit generates a bias voltage Vg at the common node between the drain of transistor M4 and the drain/gate of transistor Ml. This output voltage Vg is, for instance, used to bias gate terminals of MOSFETs in amplifiers, or other electronic circuits that need constant transconductance across PVT variations.

Some disadvantages of the circuit shown in FIG. 1 are:
1. The complex behavior of MOSFETs renders this circuit incapable of tracking the PVT variations in actual applications. Even transistor M1 (in FIG. 1) does not exhibit a constant transconductance across PVT variations.
2. The generation of only the bias voltage Vg is not enough to mirror the biasing conditions to other MOSFETs in other circuits connected to bias voltage Vg, potentially leading to significant errors in the definition of the current of the other circuit to be biased by the constant-gm circuit. The uncertainty in the definition of the transconductance is even higher.

SUMMARY

It is an object to solve one or more of the above mentioned problems. In a first aspect, the object of the invention is to provide an electronic biasing circuit in which the transconductances of the biasing circuit MOSFETs are practically constant against PVT variations, even in deep submicron CMOS technologies, where the behavior of MOSFETs deviates drastically from the quadratic model. Such a biasing circuit is claimed in independent claim 1.

By doing so. MOSFETs are allowed to be biased in weak inversion in order to maximize the transconductance efficiency (=transconductance/bias_current), while still providing PVT robustness, despite the very low output resistance of weakly inverted MOSFETs at minimum length channels (due to intensified Drain Induced Barrier Lowering—DIBL).

The claims that depend on claim 1 are focusing on advantageous embodiments. In one such embodiment, the resistor element is a variable resistor element (Rbv). This allows gain switching in a ratiometric way, which is accurate across PVT variations.

In a second aspect, it is an object to provide an electronic circuit with a biasing circuit and a circuit to be biased by the biasing circuit, in which the biasing conditions from the biasing circuit are accurately mirrored to the circuit to be biased, typically an amplifier, which leads to both current and transconductance accurate mirroring, even in deep submicron CMOS technologies. To that effect, the present invention claims such an electronic circuit in claim 9. Advantageous embodiments of such electronic circuits are claimed in dependent claims 10-17.

In an embodiment, as claimed in claims 10 and 11, a reference supply voltage for, e.g., a Low Drop Out regulator that powers an amplifier is also generated by the biasing circuit, leading to improved on chip isolation between circuit blocks in integrated circuits, and less parasitic coupling by eliminating the need to route long wires to a separate PVT compensated and precise voltage reference.

Embodiments claimed in claims 15 and 16 allow multi-level cascode gain switching, which is accurate across PVT variations. In combination with the above mentioned variable resistor element, if applied, this results in optimizing the tradeoff between amplifier performance and current consumption, by combining the benefits of cascode gain switching and resistor based gain switching in the biasing circuit.

DESCRIPTION OF THE DRAWINGS

The invention will be explained in detail with reference to some drawings that are only intended to show embodiments of the invention and not to limit the scope. The scope of the invention is defined in the annexed claims and by its technical equivalents. I.e., a person skilled in the art will understand that features, components, elements, etc. explicitly used to explain the invention can be substituted by technical equivalents unless otherwise stated. The drawings show:

DESCRIPTION OF A PREFERRED EMBODIMENT

In the explanation below, like reference numbers/signs in different drawings are used to refer to the same components/elements.

Figure 1:
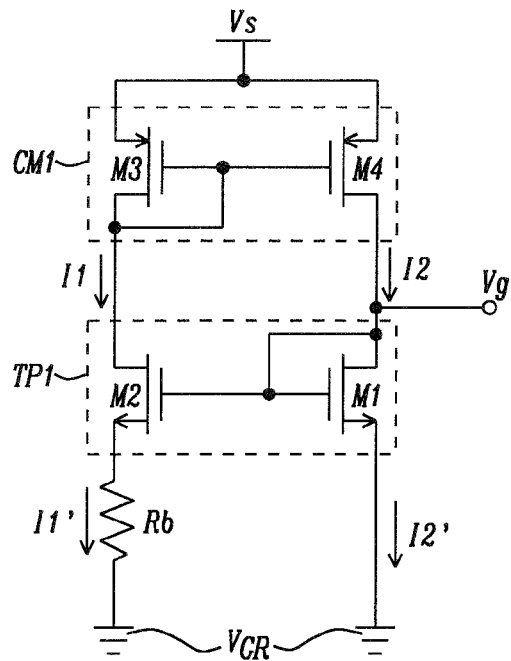
FIG. 1 shows a traditional circuit for generating constant transconductance biasing conditions.
Figure 2:
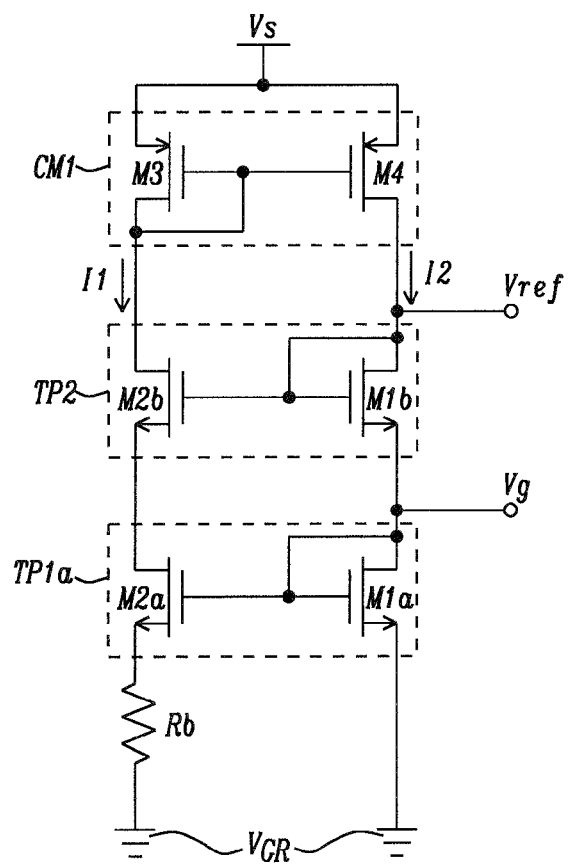
FIG. 2 shows a circuit for generating constant transconductance biasing conditions according to the present invention.

FIG. 2 shows an embodiment of a biasing circuit in accordance with the present invention. Current mirror CM1 is the same as in FIG. 1. A first transistor pair TP1a has two transistors M1a, M2a, arranged in the same way as transistors M1, M2 in FIG. 1.

The difference with FIG. 1 is the inclusion of a second transistor pair TP2 which comprises an NMOS transistor M1b and an NMOS transistor M2b. Transistor M1b has its gate connected to its drain which is also connected to the drain of transistor M4. The transistor M1b has a source connected to the drain of transistor M1a. Transistor M2b has a drain connected to the drain of transistor M3. The transistor M2b has a source connected to the drain of transistor M2a.

Like in the prior art arrangement of FIG. 1, the gate/drain of transistor M1a, which is now connected to the source of transistor M1b, provides bias voltage Vg. However, the drain of transistor M4, which is now connected to the drain of transistor M1b, may now provide a reference voltage Vref, as will be explained later in more detail.

By including the transistors M1b and M2b which are of the same MOSFET type (i.e., both are NMOS transistors) in the constant-gm biasing circuit, as shown in FIG. 2, the transconductances of the biasing circuit MOSFETs are more constant against PVT variations. Those transistors M1b and M2b make sure that the voltages at the drains of transistors M1a and M2a remain closer to each other, leading to a better-controlled definition of transconductance. In the example of FIG. 2, transistors M3 and M4 should have equal sizes, whereas transistors M2a and M2b have higher W/L ratios than transistors M1a and M1b, e.g. typically 4 times higher.

It is important to note that, if two PMOS transistors were added in a complementary way just after the PMOS transistors M3 and M4 instead, there would be no benefit, as the result would just be a cascode PMOS mirror, being able to sustain a very high voltage difference at its outputs while mirroring accurately the current between its branches, which is not the desired environment for transistors M1a and M2a. But, the whole setup can be inverted as long as all transistors M1a, M1b, M2a, M2b are of the same MOSFET type, i.e., are either NMOS or PMOS transistors, and transistors M3, M4 are of the opposite MOSFET type.

Figure 3:
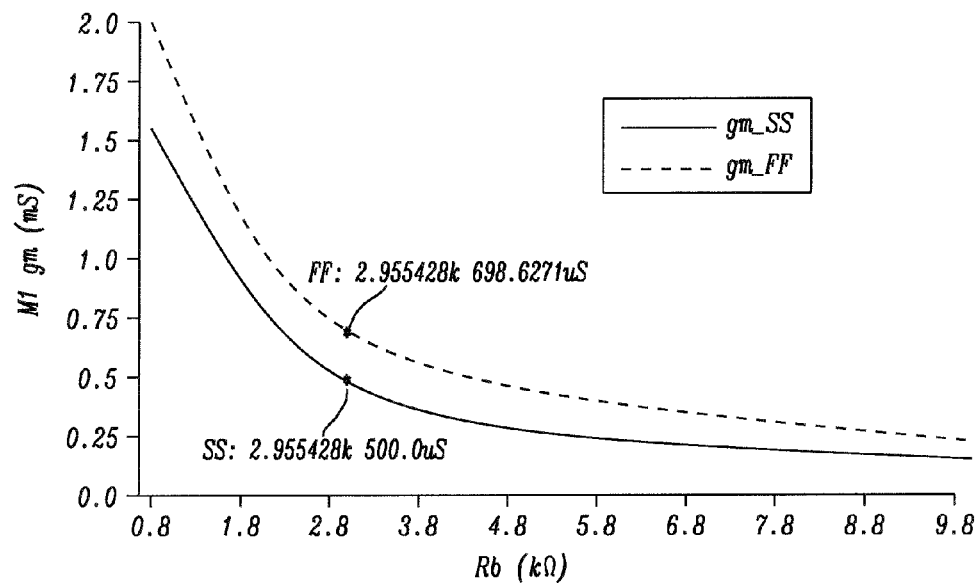
FIG. 3 shows a curve of transconductance vs bias resistor Rb for a traditional constant-gm circuit, for a slow and a fast process corner. A slow (fast) process corner is mainly characterized by a higher (lower) than normal oxide thickness, higher (lower) than normal threshold voltage, and lower (higher) than normal carrier mobility.
Figure 4:
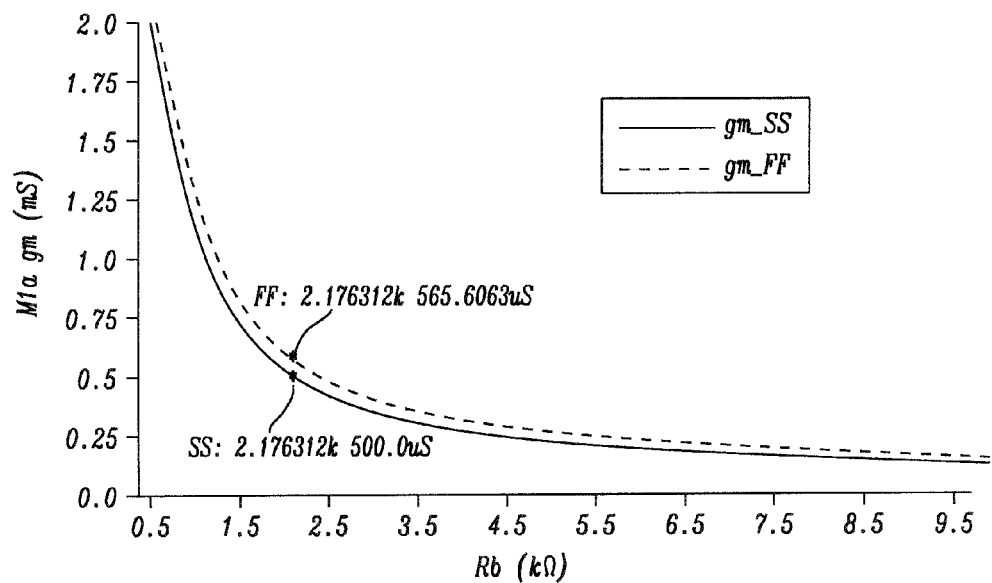
FIG. 4 shows a curve of transconductance vs bias resistor Rb for a constant-gm circuit according to the invention, for a slow and a fast process.

As an example of the improvement this proposal brings, a comparison in the transconductance dependence on MOSFET process corner (slow/fast) is made for the traditional constant-gm circuit (FIG. 3) and the proposed one (FIG. 4). FIG. 3 and FIG. 4, respectively, show the transconductance of transistor M1 and M1a, respectively, in mS as a function of the resistance of resistor element Rb (in kΩ). The solid line shows the relationship for a slow process corner (i.e., higher than normal oxide thickness, higher than normal threshold voltage, and lower than normal carrier mobility), whereas the dotted line shows the relationship for a fast process corner (i.e., lower than normal oxide thickness, lower than normal threshold voltage, and higher than normal carrier mobility).

FIG. 3 shows that, for a minimum desired M1 transconductance of 0.5 mS, in the case of the traditional biasing circuit of FIG. 1, the error in the transconductance value due to process variations is around 0.2 mS (0.5 mS at the slow process corner and 0.7 mS at the fast one). In the case of the proposed biasing circuit of FIG. 2, the relevant error for a minimum desired M1a transconductance of 0.5 mS is now only 0.066 mS, as shown in FIG. 4, that is, 3 times smaller than the traditional error.

Figure 5:
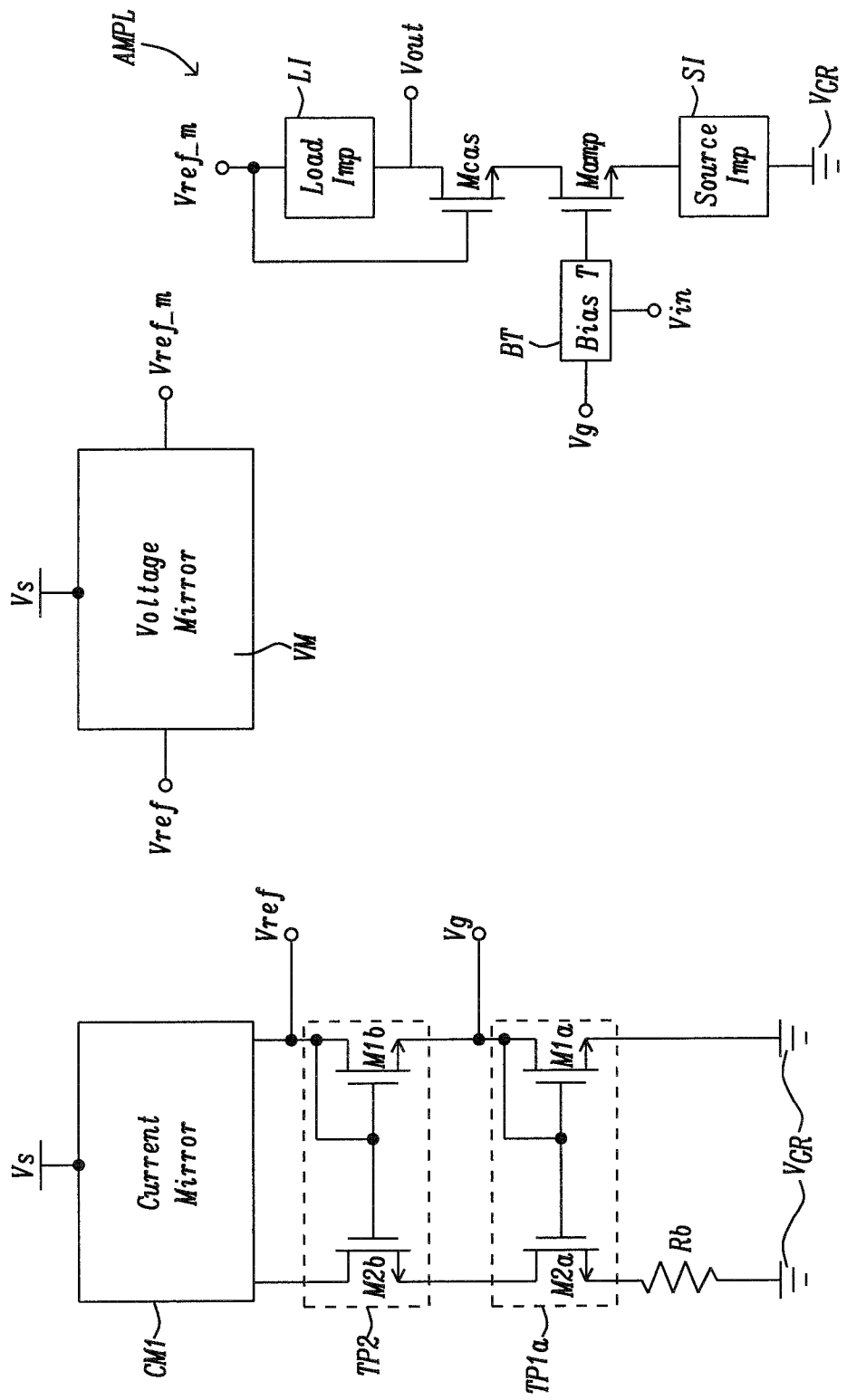
FIG. 5 shows a schematic diagram of a proposed biasing topology.

The ultimate goal of designing a biasing circuit is, however, to define the transconductance of an actual circuit to be biased and connected to bias voltage Vg, e.g. an amplifier, and not only the transconductance of the biasing circuit itself. In order to achieve this, accurate mirroring of the core of the circuit to be biased and the biasing circuit environments is required. The traditional biasing circuit fails to do so. On the other hand, the biasing circuit shown in FIG. 2 lends itself to replicating the environment of nowadays, most popular amplifier topology, namely, the cascode topology. FIG. 5 shows the schematic diagram of the proposed biasing topology. Nodes with the same name such as Vg, Vref, and Vref_m in different parts of the circuit shown are connected (connecting wires not shown for clarity reasons). The left part of FIG. 5 shows the biasing circuit of FIG. 2. The middle part of FIG. 5 shows a voltage mirror VM, whereas the right part shows a schematic diagram of a cascode amplifier AMPL.

The voltage mirror VM is an electronic circuit arranged to copy an input voltage to an output voltage, i.e. the reference voltage Vref to a mirrored reference Vref_m, without loading the Vref node, so without loading the gate/drain of transistor M1b in the biasing circuit. Voltage Vref_m is the power supply voltage to amplifier AMPL. Implementations of the voltage mirror VM include, but are not limited to, Low Drop Out regulators. In general, linear or switching feedback voltage regulators can serve as a voltage mirror.

The use of a Low Drop Out regulator per block in integrated circuits has become quite popular, since it allows more efficient power control of complex integrated systems, more isolation between blocks, and lower pin count. This topology reuses the Low Drop Out regulator to achieve, among others, the stability in the transconductance across PVT variations. In typical prior art cases, the Low Drop Out regulator is connected to a reference voltage Vref, that is generated by a precise and PVT compensated circuit, via typically long on chip conductor lines that can cross ground domains and pick up noisy signals. Using the proposed biasing topology, the reference voltage Vref is generated by the biasing circuit itself, and, thus, the need for long conductor lines is eliminated, and the complete system can reside in one ground domain, leading to less noise coupling.

The amplifier AMPL in the right part of FIG. 5 comprises a cascode core, i.e. at least one MOS transistor Mcas, connected in series with a main amplifying MOSFET Mamp. Note that if more than one cascode transistors are used, they have to be replicated in the biasing circuit as well. The transistor Mcas has a drain connected to one side of a load impedance (Load Imp) LI, which drain also provides an output voltage Vout. The transistor Mcas has a gate connected to the other side of the load impedance LI. Transistor Mcas has a source connected to a drain of an amplifying transistor Mamp. This transistor Mamp is the main amplifying MOSFET of the amplifier AMPL. A source impedance (Source Imp) SI is connected between a source of transistor Mamp and ground $V_{GR}$.

Figure 7:
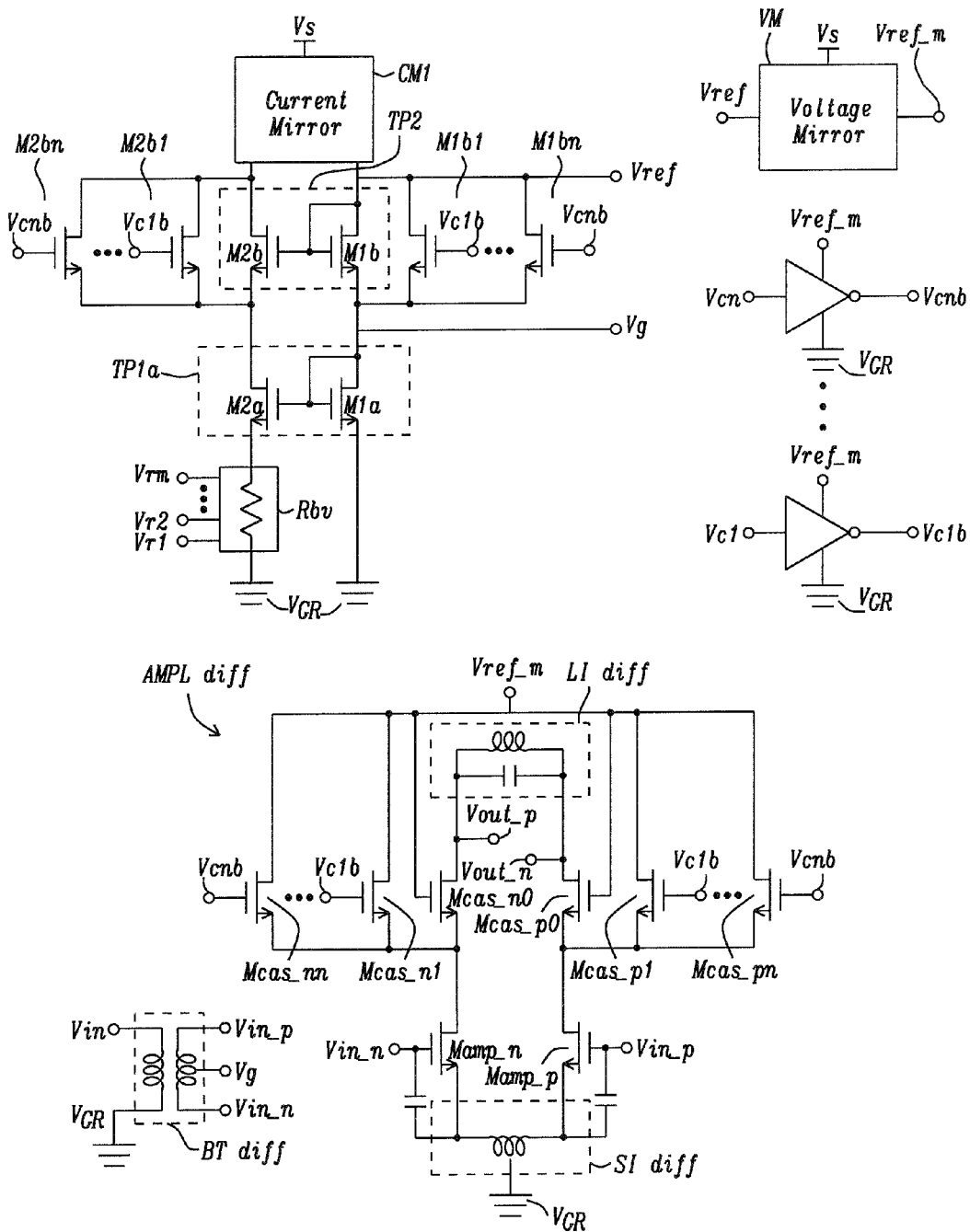
FIG. 7 shows cascode gain switching replication at the biasing circuit.
Figure 8:
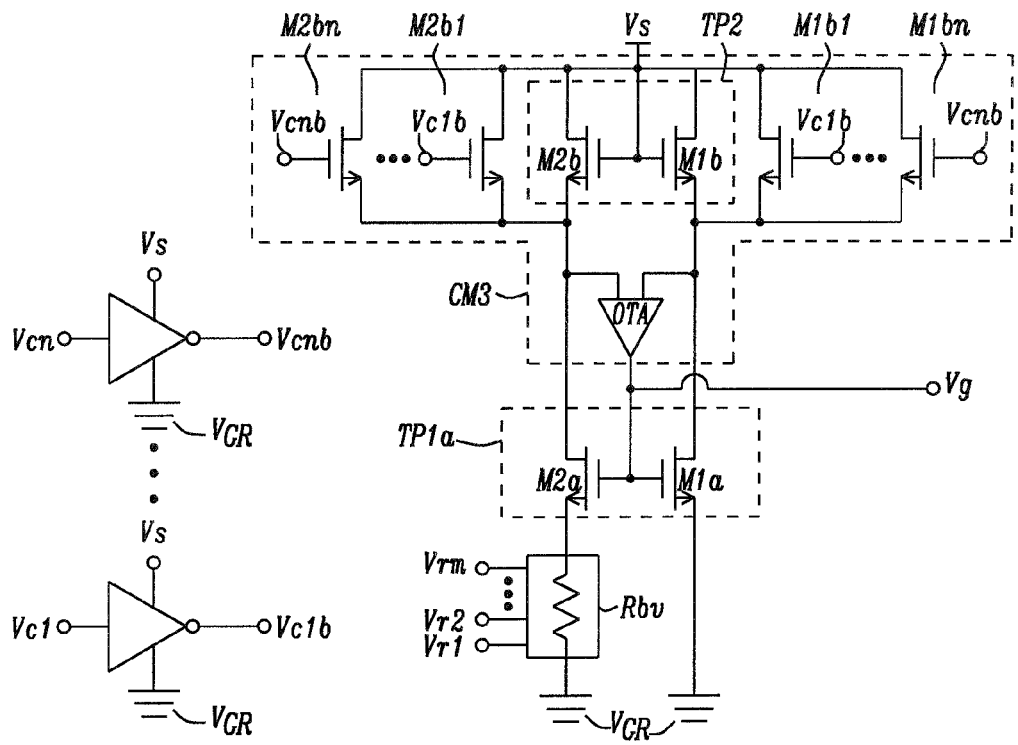
FIG. 8 shows an alternative embodiment to the circuit of FIG. 7.
Figure 8:
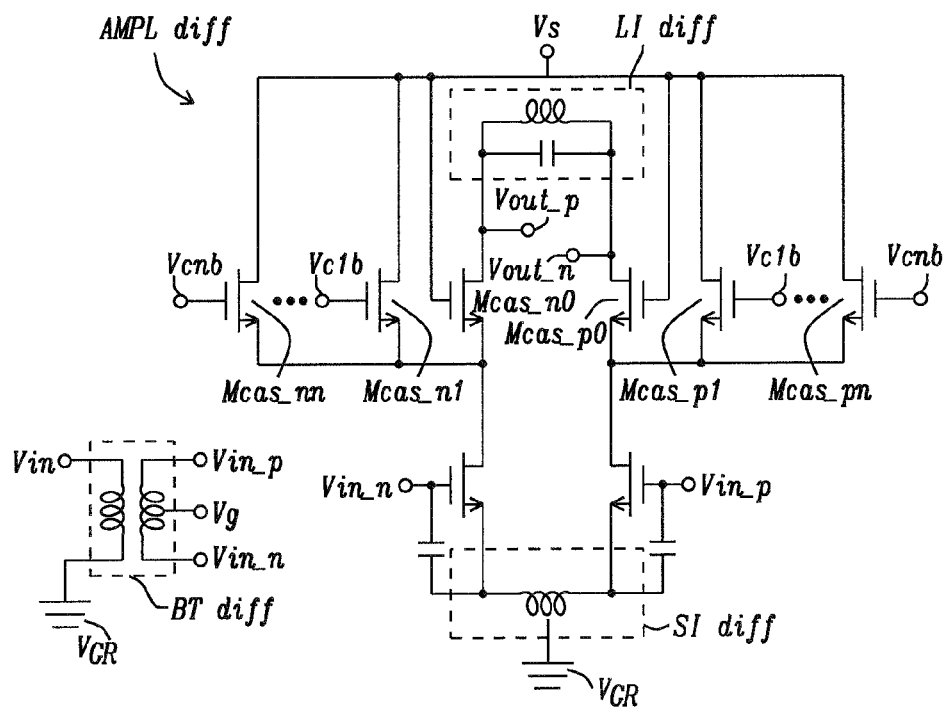

Transistor Mamp has a gate connected to an output of an input circuit BT. The input circuit BT is a Bias Tee which receives bias voltage Vg of the biasing circuit. Input circuit BT has an input terminal arranged to receive an AC input voltage Vin which is to be amplified by the amplifier to render amplified output voltage Vout. The aforementioned load impedance LI and source impedance SI are both arranged to provide a near 0 ohms impedance at DC level. If for any reason their impedance at DC level has to be different, they should also be replicated at the biasing circuit. The input circuit BT can be any electronic circuit that allows DC bias voltage Vg to be connected to the gate of transistor Mamp in a DC sense, and allows the input voltage Vin to be connected to the gate of transistor Mamp in an AC sense. What is more, the amplifier AMPL can be either single-ended, i.e. having one output terminal to provide output signal Vout, as shown in FIG. 5, or differential, as shown in FIGS. 7 and 8. It can be generalized to every circuit that incorporates a cascode transconductor.

Figure 6:
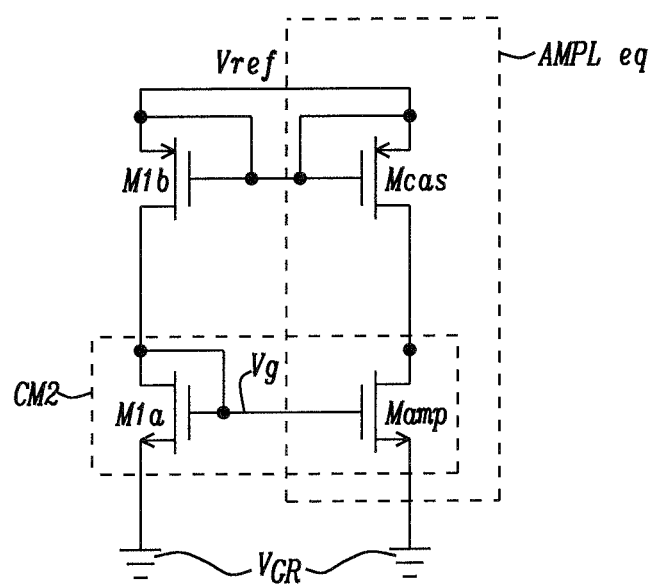
FIG. 6 shows an equivalent circuit of FIG. 5 at DC, with respect to the biasing view.

At DC or almost DC (very low frequencies) not only the load impedance LI and source impedance SI are substantially equal to 0 ohm, but that also applies to the DC path of the input circuit BT (from Vg to the gate of Mamp). What is more, the voltage mirror VM makes sure that the voltages at the gates of transistor M1$b$ and transistor Mcas are substantially equal. Therefore, then, the circuit of the amplifier AMPL, with respect to the biasing view, becomes substantially identical to an equivalent circuit AMPLeq comprising the two transistors Mcas and Mamp1 in series as shown in FIG. 6, in which transistor Mcas has its gate short circuited to its drain.

As shown, the amplifier AMPL becomes substantially identical to the series connection of transistors M1$a$, M1$b$ of the biasing circuit. The only difference is that the amplifying transistor Mamp of the amplifier AMPL is not diode connected. So, the system of the four NMOS transistors M1$a$, M1$b$, Mamp, Mcas can be seen as a second current mirror CM2, consisting of transistor M1$a$ and amplifying transistor Mamp, with diode connected transistor M1$b$ as a load for transistor M1$a$ and identically diode connected transistor Mcas as a load for amplifying transistor Mamp. That is, perfect mirroring of the currents and all voltages between the series connection of transistors M1$a$, M1$b$ and the series connection of transistors Mcas and Mamp is achieved and, thus, perfect transconductance mirroring as well.

It is apparent that the "matching" transistors, i.e. transistor M1$a$ with transistor Mamp and transistor M1$b$ with transistor Mcas, don't have to be the same size, i.e., the ratio of the sizes is what counts. For example, if transistor Mamp has a total Wamp/Lamp ratio (taking into account fingering, multiplicity and in general all ways of sizing a MOSFET) that is twice the ratio W1$a$/L1$a$ of transistor M1$a$, than ratio Wcas/Lcas of transistor Mcas should also be twice the ratio W1$b$/L1$b$ of transistor M1$b$. What is more, the whole topology (bias circuit and amplifier) can be generated in complementary form, in case PMOS devices need to be used in the amplifier.

Gain Programmability

As explained above, the transconductances of the MOSFET transistors in the proposed biasing circuit are PVT robust and the amplifier environment is almost precisely replicated in the biasing circuit. I.e., in the above example the series connection of transistor Mcas and Mamp1 in the amplifier AMPL is, in the equivalent circuit for DC level, almost identically present at the output side of the biasing circuit by means of the series connection of transistors M1$a$ and M1$b$. These facts together make sure that the transconductance of the amplifier is really inversely proportionally (1/x) related to the bias resistor value Rb, even in deep submicron technologies. That is, if we double the resistor value Rb, then the transconductance, and, thus, the voltage gain of the amplifier AMPL, will halve, i.e. accurately drop by 6 dB.

So, by incorporating a suitable resistor network, we can achieve gain programmability in a very simple and efficient way. I.e., one just has to switch DC bias resistors, not high frequency signals, where the gain difference (in dB) can be very well controlled as it depends on resistor ratios which can be very well controlled in IC processes. Accurate gain difference is required in receivers with automatic gain control, because, otherwise, the received signal strength indication (RSSI) function of the receiver is not linear with respect to the input signal level.

Gain programmability can be typically achieved by cascode gain switching, where extra cascode MOSFET transistors are connected in the amplifier AMPL as shown in FIG. 7.

In the lower part of FIG. 7 a differential amplifier AMPLdiff is shown. The differential amplifier AMPLdiff comprises a cascode transistor Mcas_n0. The transistor Mcas_n0 has a drain connected to one side of a load impedance LIdiff, which drain also provides a positive part Vout_p of an output voltage Vout. The transistor Mcas_n0 has a gate connected to power supply voltage Vref_m. Transistor Mcas_n0 has a source connected to a drain of an amplifying transistor Mamp_n. This transistor Mamp_n is one of two main amplifying MOSFETs of the differential amplifier AMPLdiff. A source impedance SIdiff is connected between a source of transistor Mamp_n and ground $V_{GR}$.

Transistor Mamp_n has a gate connected to an output voltage Vin_n of an input circuit BTdiff. The gate of transistor Mamp_n can be connected to its source via a capacitor.

The load impedance LIdiff comprises a parallel circuit of a capacitor and a coil of which one side is connected to the drain of transistor Mcas_n0. The coil has an intermediate branch connected to power supply voltage Vref_m.

The source impedance SIdiff is a coil having one side connected to the gate of transistors Mamp_n and an intermediate branch connected to ground $V_{GR}$.

The differential amplifier AMPLdiff also comprises a cascode transistor Mcas_p0. The transistor Mcas_p0 has a drain connected to another side of load impedance LIdiff, which drain also provides a negative part Vout_n of an output voltage Vout. The intermediate branch of the coil of load impedance LIdiff is arranged such that the same impedance is available between supply voltage terminal Vref_m and the drain of transistor Mcas_n0 and between supply voltage terminal Vref_m and the drain of transistor Mcas_p0.

The output voltage Vout is a differential output voltage defined by Vout_p−Vout_n. The transistor Mcas_p0 has a gate connected to power supply voltage Vref_m. Transistor Mcas_p0 has a source connected to a drain of an amplifying transistor Mamp_p. This transistor Mamp_p is another one of two main amplifying MOSFETs of the differential amplifier AMPLdiff. The source of transistor Mamp_p is connected to the other side of source impedance SIdiff.

The intermediate branch of the coil of source impedance SIdiff is arranged such that the same impedance is available between ground $V_{GR}$ and the source of transistor Mamp_n and between ground $V_{GR}$ and the source of transistor Mamp_p. Transistor Mamp_p has a gate connected to an output voltage Vin_p of input circuit BTdiff. The gate of transistor Mamp_p can be connected to its source via a capacitor, preferably identical to the one connected to Mamp_n.

In the circuit of FIG. 7 the input signal is a differential voltage Vin=Vin_p−Vin_n. This differential signal Vin_p−Vin_n is produced by an input circuit BTdiff. The input circuit BTdiff comprises a transformer having a first coil connected between input voltage Vin and ground $V_{GR}$, and a second coil of which one terminal provides output voltage Vout_p and another terminal provides output voltage Vout_n. Between these two terminals, the second coil is connected to supply bias voltage Vg as produced by the biasing circuit.

A plurality of n cascode transistors Mcas_n1, . . . , Mcas_nn is arranged in parallel to each other. I.e., all sources of transistors Mcas_n1, . . . , Mcas_nn are connected together and connected to the source of transistor Mcas_n0. Moreover, all drains of transistors Mcas_n1, . . . , Mcas_nn are connected together and connected to supply voltage Vref_m. Gates of these transistors Mcas_n1, . . . , Mcas_nn receive respective control voltages Vc1b, . . . , Vcnb. As shown, in the embodiment of FIG. 7, these control voltages Vc1b, . . . , Vcnb are derived from basic control voltages Vc1, . . . , Vcn buffered by at least one digital gate which receives a power supply substantially equal to the DC voltage Vref_m.

Similarly, a plurality of n cascode transistors Mcas_p1, . . . , Mcas_pn is arranged in parallel to each other. I.e., all sources of transistors Mcas_p1, . . . , Mcas_pn are connected together and connected to the source of transistor Mcas_p0. Moreover, all drains of transistors Mcas_p1, . . . , Mcas_pn are connected together and connected to supply voltage Vref_m. Gates of these transistors Mcas_p1, . . . , Mcas_pn receive respective control voltages Vc1b, . . . , Vcnb, i.e. the same control voltages as applied to the gates of transistors Mcas_n1, . . . , Mcas_nn, respectively.

The control voltages Vc1b, . . . , Vcnb may be generated from a set of original control voltages Vc1, . . . , Vcn. I.e., the control signals Vc1b, . . . , Vcnb, applied at the gates of the switched cascode transistors may be buffered by inverters/chains of inverters, out of which the last inverter is powered by the Vref_m supply of the voltage mirror. This guarantees precise replication of the voltages during all possible modes.

In order to mirror the circuit of FIG. 7, i.e. actually its DC equivalent circuit, in the biasing circuit, FIG. 7 shows the following features:

A same plurality of n biasing cascode transistors M2b1, . . . , M2bn is arranged in parallel to transistor M2b. I.e., all sources of biasing cascode transistors M2b1, . . . , M2bn are connected together and connected to the source of transistor M2b. Moreover, all drains of transistors M2b1, . . . , M2bn are connected together and connected to the gate of transistor M2b. All these drains are also connected to the drain of transistor M2b. However, note that, if impedance LI_diff in the circuit to be biased AMPL_diff has a DC resistance not close to 0 Ohm, a resistance could be applied between the drains of transistors M2b1, . . . , M2bn and the drain of transistor M2b with an equivalent value to the one of impedance LI_diff. In this case, the drains of transistors M2b1, . . . , M2bn would be connected to the gate of transistor M2b.

A same plurality of n biasing cascode transistors M1b1, . . . , M1bn is arranged in parallel to transistor M1b. I.e., all sources of biasing cascode transistors M1b1, . . . , M1bn are connected together and connected to the source of transistor M1b. Moreover, all drains of transistors M1b1, . . . , M1bn are connected together and connected to the gate of transistor M1b. All these drains are also connected to the drain of transistor M1b. However, note that, if impedance LI_diff in the circuit to be biased AMPL_diff has a DC resistance not close to 0 Ohm, a resistance could be applied between the drains of transistors M1b1, . . . , M1bn and the drain of transistor M1b with an equivalent value to the one of impedance LI_diff. In this case, the drains of transistors M1b1, . . . , M1bn would still be connected to the gate of transistor M1b.

Gates of respective biasing cascode transistors M2b1, . . . , M2bn receive the abovementioned respective control voltages Vc1b, . . . , Vcnb.

Gates of respective biasing cascode transistors M1b1, . . . , M1bn also receive the abovementioned respective control voltages Vc1b, . . . , Vcnb.

Moreover, resistor element Rb has been substituted by a variable resistor element Rbv. Variable resistor element is arranged to provide a variable resistance value between the source of transistor M2a and ground $V_{GR}$. This variable resistor element can be implemented in known way. It may advantageously be controllable by a plurality of different control voltages Vr1, . . . , Vrm, such that the variable resistance value can be controlled to be one of a plurality of discrete different values.

When the cascode is not activated, i.e. when all of the control voltages Vc1b, . . . , Vcnb are such that neither one of the transistors receiving these control voltages Vc1b, . . . , Vcnb at their respective gates is active the amplifier AMPLdiff operates normally, i.e. in the high gain mode. When e.g. cascode transistor Mcas_n1 is activated, depending on its size, it steals a proportional amount of AC current from transistor Mcas_n0 and steers this stolen current directly to the supply voltage Vref_m, instead of through the load impedance LIdiff. For example, supposing that Mcas_n1 and Mcas_n2 are the activated switched cascode transistors at the left side of AMPLdiff, and Mcas_p1 and Mcas_p2 are the activated switched cascode transistors at the right side of AMPLdiff, then, if the total combined size of those activated switched cascode transistors per side of AMPLdiff, respectively, i.e. the combined size of transistors Mcas_n1 and Mcas_n2 for the left side and the combined size of transistors Mcas_p1 and Mcas_p2 for the right side, respectively, is equal to the sizes of the basic cascode transistors Mcas_n0 and Mcas_p0, respectively, then half of the AC current does not flow through the load impedance LIdiff, and thus the gain is 6 dB lower. Different gain steps are also possible, depending on the total size of the activated switched cascode transistors Mcas_n1, . . . , Mcas_nn, Mcas_p1, . . . , Mcas_pn. Since (digital) control voltages Vc1, . . . , Vcn control the switching of the cascode Mcas_n1, . . . , Mcas_nn, Mcas_p1, . . . , Mcas_pn, they control the gain as obtained by the amplifier AMPL. The benefit of this mechanism of gain switching is that it does not affect the biasing of the amplifier AMPLdiff, and, thus, the input related Figures of merit of the amplifier AMPLdiff, like the input impedance and the noise Figure. The downside is of course the fact that no current is saved while lowering the gain.

If gain programmability needs to be supported by means of cascode gain switching, then the switched cascode structure is preferably also replicated at the biasing circuit, so that the cascode gain switching is also accurate across PVT variations. FIG. 7, as explained above, depicts the replication of the switched cascode transistors Mcas_n1, . . . , Mcas_nn, Mcas_p1, . . . , Mcas_pn in the biasing circuit.

In an embodiment, the sizes of the biasing MOSFETs M2a, M2b, respectively, are 4 times the sizes of the biasing MOSFETs M1a, M1b, respectively. The sizes of the biasing cascode transistors M2b1, . . . , M2bn, respectively, are 4 times the sizes of the biasing cascode transistors M1b1, . . . , M1bn, respectively. The size ratio between the biasing transistor M1a and the amplifier transistor Mamp_n, is the same as the size ratio between the biasing transistor M1a and the amplifier transistor Mamp_p, and the same as the size ratio between the biasing transistor M1b and the amplifier transistor Mcas_n0, and the same as the size ratio between the biasing transistor M1b and the amplifier transistor Mcas_p0, and the same as the size ratios between the biasing transistors M1b1, . . . , M1bn, respectively, and the switched cascode transistors Mcas_n1, . . . , Mcas_nn, respectively, and the same as the size ratios between the biasing transistors M1b1, . . . , M1bn, respectively, and the switched cascode transistors Mcas_p1, . . . , Mcas_pn, respectively. Then, the size ratio between the biasing cascode transistors M2b1, . . . , M2bn, respectively, and transistor M2b, the size ratio between the biasing cascode transistors M1b1, . . . , M1bn, respectively, and transistor M1b, the size ratio between the cascode transistors Mcas_n1, . . . , Mcas_nn, respectively, and cascode transistor Mcas_n0, and the size ratio between the cascode transistors Mcas_p1, . . . , Mcas_pn, respectively, and cascode transistor Mcas_p0 are also all the same. One could, alternatively, also replicate the switched cascode structure only on the right branch of the biasing circuit of FIG. 7, so leaving out biasing cascode transistors M2b1, . . . , M2bn, but with reduction in accuracy.

The amplifier AMPLdiff used in FIG. 7 is a differential, low noise, cascode, tuned amplifier. Of course, the same principle would apply to a single ended amplifier AMPL as shown in FIG. 5.

The two abovementioned gain mechanisms, i.e. gain switching by means of the switched cascode structure and by means of the variable resistor element Rbv can be implemented independently. However, they can, alternatively, be combined. If we combine the two gain switching mechanisms, we can gain more flexibility in optimizing the system. For example, we could combine the two mechanisms just to get more range of programmable gain. We could even combine them for just one, even small, gain step, in order to find the optimum point between current consumption savings (by Rbv programmability) and keeping the input related Figures of merit of the amplifier AMPL or AMPLdiff unaffected (by cascode gain switching). For example, if a gain step of 12 dB is required, then e.g. 6 dB could be allocated to Rbv programmability, rendering the current consumption even less than half-due to the weaker inversion, and thus, higher transconductance efficiency- in the low gain mode, and the rest 6 dB could be addressed by the cascode gain switching. Different allocations are possible depending on the system optimization. Simple digital look up tables could abstract the allocation of gain steps in the two mechanisms in a small set of user-friendly predefined gain settings.

Alternative Embodiment

FIG. 8 illustrates an alternative implementation of FIG. 7. The differential amplifier AMPLdiff is identical to the one in FIG. 7 and is indicated with the same reference signs.

The difference is that the voltage mirror VM is not applied. In this case, the replication of the supply voltage of the amplifier AMPLdiff, which was Vref_m in FIG. 7 but is now voltage $V_S$, is achieved by removing the PMOS current mirror CM1 completely from the biasing circuit and connecting the drains of cascode transistors M2b1, . . . , M2bn, M1b1, . . . , M1bn, as well as the drains of transistors M2b and M1b of the biasing circuit directly to the supply voltage $V_S$, as is the case for the amplifier AMPLdiff itself.

Moreover, since we do not have voltage Vref_m, as shown, in the embodiment of FIG. 8, the control voltages Vc1b, . . . , Vcnb are derived from basic control voltages Vc1, . . . , Vcn buffered by at least one digital gate which receives supply voltage $V_S$.

Preferably, the sizes of the biasing cascode transistors M2b, M2b1, . . . ,M2bn, respectively, are equal to the sizes of the biasing cascode transistors M1b, M1b1, . . . , M1bn, respectively. The size of the biasing MOSFET M2a is preferably 4 times the size of the biasing MOSFET M1a. The size ratio between the biasing transistor M1a and the amplifier transistor Mamp_n, is the same as the size ratio between the biasing transistor Mia and the amplifier transistor Mamp_p, and the same as the size ratio between the biasing transistor M1b and the amplifier transistor Mcas_n0, and the same as the size ratio between the biasing transistor M1b and the amplifier transistor Mcas_p0, and the same as the size ratios between the biasing transistors M1b1, . . . , M1bn, respectively, and the switched cascode transistors Mcas_n1, . . . , Mcas_nn, respectively, and the same as the size ratios between the biasing transistors M1b1, . . . , M1bn, respectively, and the switched cascode transistors Mcas_p1, . . . , Mcas_pn, respectively.

An operational transconductance amplifier OTA is shown in the middle of the biasing circuit. The OTA has two input terminals. A first input terminal is connected to the drain of transistor M1a, whereas a second terminal is connected to the drain of transistor M2a. The OTA has one output terminal which is connected to the interconnected gates of transistors M1a, M2a. Note that the output terminal of the OTA now provides bias voltage Vg.

The switched cascode transistors M2b1, . . . , M2bn, M1b1, . . . , M1bn, and cascode transistors M2b, M1b of the biasing circuit, together with the OTA operate together as a required current mirror CM3. Indeed, the equality of the combined cascode device sizes in the left and right branches of the biasing circuit, in conjunction with the equality of the voltages across all the nodes, results in equal currents in the left and right branches of the biasing circuit. What is more, the OTA makes sure that, not only the currents, but also the voltages at the drains of M1a and M2a are equal, leading to excellent transconductance definition, and, thus, robustness against PVT variations.

This implementation also lends itself to supporting both gain setting mechanisms, namely, cascade gain switching and Rbv-based gain switching, and their combination. Furthermore, the topology of the amplifier is not limited to the one depicted in FIG. 8. For example a single ended topology, or a topology with more cascodes stacked on top of each other, or any other topology as long as the right half of the biasing circuit is able to replicate it at DC or almost DC (low frequencies) are also possible.

The following summarizing statements can be made.

An important difference with the prior art is the inclusion of MOSFETs M1b, M2b having the same MOSFET type as transistors M1a, M2a (see FIG. 2) in the constant-gm biasing circuit, which renders the transconductance gm of the biasing circuit MOSFETs practically constant against PVT variations, even using minimum length MOSFETs in weak inversion in deep submicron CMOS technologies.

Secondly, the biasing circuit does not only generate the gate bias voltage Vg, but may also provide the reference supply voltage Vref for the Low Drop Out regulator that powers the amplifier (or other circuit to be biased), on a same ground domain. Thus, a separate PVT compensated and precise voltage reference circuit, as well as the required top-level routing of the reference supply voltage, is no more necessary, leading to improved on chip isolation and lower top-level layout effort. Alternatively, in an embodiment where the Low Drop Out regulator (or other voltage mirror) is avoided, the same power supply $V_S$ can be used.

A third important feature is the replication of the core circuitry of the circuit to be biased in the biasing circuit, including cascode gain switching structures in the embodiment where such cascode switching is used.

Fourthly, in an embodiment, digital circuitry can be provided to combine the two gain switching mechanisms, namely, Rbv programmability gain switching and cascode gain switching.

It is to be understood that the invention is limited by the annexed claims and its technical equivalents only. In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

PRIOR ART

[1] Section 11.5 of "Behzad Razavi, Design of Analog CMOS Integrated Circuits, McGraw-Hill, 2000".

The invention claimed is:

1. An electronic biasing circuit arranged to provide a DC bias voltage to a circuit to be biased by said DC bias voltage, the biasing circuit comprising a first transistor pair comprising a first transistor and a second transistor both being of a first MOSFET type, a gate of said first transistor being connected to a gate of said second transistor and arranged to supply said DC bias voltage, a source of said first transistor being connected to a supply reference voltage, a source of said second transistor being connected to said supply reference voltage via a resistor element, in use a first current flowing through said first transistor and a second current flowing through said second transistor, the electronic biasing circuit comprising circuit components arranged to cause said first current and said second current to be substantially equal, wherein the biasing circuit comprises a second transistor pair comprising a third transistor and a fourth transistor of said same first MOSFET type, which third transistor is, at one side, connected in series with said first transistor at a first common node, and a gate of said third transistor being connected to a gate of said fourth transistor, a source of said fourth transistor being connected to a drain of said second transistor at a second common node, in use a third current flowing through said third transistor and a fourth current flowing through said fourth transistor, said circuit components also being arranged to cause said third current and said fourth current to be substantially equal, and said circuit components comprise an operational transconductance amplifier, said gate of said first transistor and said gate of said second transistor being connected to an output of said operational transconductance amplifier which has a first input connected to said source of said third transistor and a second input connected to a said source of said fourth transistor.

2. The electronic biasing circuit according to claim 1, wherein said gate of said third transistor is arranged to provide a DC reference voltage level.

3. The electronic biasing circuit according to claim 1, wherein said biasing circuit comprises a first set of n biasing cascode transistors, n being 1 or more, all drains of said first set of n biasing cascode transistors being interconnected and connected to said drain of said third transistor, all sources of said set of n biasing cascode transistors being interconnected and connected to a source of said third transistor, said gates of said first set of n biasing cascade transistors being arranged to receive a respective different one of a set of n control voltages, said biasing circuit comprising also a second set of n biasing cascode transistors, all drains of said second set of n biasing cascode transistors being interconnected and connected to said drain of said fourth transistor, all sources of said set of n biasing cascode transistors being interconnected and connected to a source of said fourth transistor, said gates of said second set of n biasing cascode transistors being arranged to receive a respective different one of said set of n control voltages.

4. The electronic biasing circuit according to claim 1, wherein said resistor element is a variable resistor element.

5. The electronic biasing circuit according to claim 1, wherein both said third transistor and said fourth transistor are diode connected, and have their gates connected to a power supply voltage.

6. Electronic circuit comprising at least an electronic biasing circuit according to claim 1 and a circuit to be biased by said electronic biasing circuit wherein the circuit to be biased comprises a fifth transistor of said first MOSFET type and a sixth transistor of said first MOSFET type, said sixth transistor being connected in series with said fifth transistor, the circuit to be biased being connected to said DC bias voltage produced by said biasing circuit via an input circuit such that a gate of said fifth transistor receives a first DC voltage substantially equal to said DC bias voltage.

7. Electronic circuit according to claim 6, wherein a gate of said sixth transistor is arranged to receive a second DC voltage substantially equal to DC reference voltage level as present on said gate of said third transistor.

8. Electronic circuit according to claim 7, wherein said second DC voltage is derived from said DC reference voltage level via a voltage mirror circuit.

9. Electronic circuit according to claim 6, wherein said gate of said sixth transistor is connected to a drain of said sixth transistor via a load impedance having a DC impedance of substantially 0 Ohm.

10. Electronic circuit according to claim 6, wherein a source of said fifth transistor is connected to said supply reference voltage via a source impedance having a DC impedance of substantially 0 Ohm.

11. Electronic circuit according to claim 6, wherein said input circuit has an input to receive an AC input voltage to be supplied to said gate of said fifth transistor.

12. Electronic circuit according to claim 6, wherein said circuit to be biased comprises a third set of n cascode transistors, where n is 1 or more, all drains of said third set of n cascode transistors being interconnected and connected to said gate of said sixth transistor , all sources of said third set of n cascode transistors being interconnected and connected to a source of said sixth transistor, said gates of said third set of n cascode transistors being arranged to receive a respective different one of said set of n control voltages, said control voltages being derived from basic control voltages buffered by at least one digital gate which receives a power supply substantially equal to the second DC voltage.

13. Electronic circuit according to claim 12, wherein said circuit to be biased further comprises:
a seventh transistor of said first MOSFET type, and an eighth transistor of said first MOSFET type, said seventh transistor and eighth transistor being connected in series, a gate of said seventh transistor being arranged to receive said first DC voltage too,
a fourth set of n cascade transistors, all drains of said fourth set of n cascode transistors being interconnected and connected to said gate of said eighth transistor , all sources of said fourth set of n cascode transistors being interconnected and connected to a source of said eighth transistor, said gates of said fourth set of n cascode transistors being arranged to receive a respective different one of said set of n control voltages, said control voltages being derived from basic control voltages buffered by at least one digital gate which receives a power supply substantially equal to the second DC voltage.

14. Electronic circuit according to claim 6, wherein said circuit to be biased is an amplifier, such as a differential amplifier.

15. A method of providing an electronic biasing circuit arranged to provide a DC bias voltage to a circuit to be biased by said DC bias voltage, the biasing circuit comprising a first transistor pair comprising a first transistor and a second transistor both being of a first MOSFET type, a gate of said first transistor being connected to a gate of said second transistor and arranged to supply said DC bias voltage, a source of said first transistor being connected to a supply reference voltage, a source of said second transistor being connected to said supply reference voltage via a resistor element, in use a first current flowing through said first transistor and a second current flowing through said second transistor, the electronic biasing circuit comprising circuit components arranged to cause said first current and said second current to be substantially equal,
wherein
the biasing circuit comprises a second transistor pair comprising a third transistor and a fourth transistor of said same first MOSFET type, which third transistor is, at one side, connected in series with said first transistor at a first common node, and a gate of said third transistor being connected to a gate of said fourth transistor, a source of said fourth transistor being connected to a drain of said second transistor at a second common node, in use a third current flowing through said third transistor and a fourth current flowing through said fourth transistor, said circuit components also being arranged to cause said third current and said fourth current to be substantially equal, and said circuit components comprise an operational transconductance amplifier, said gate of said first transistor and said gate of said second transistor being connected to an output of said operational transconductance amplifier which has a first input connected to said source of said third transistor and a second input connected to a said source of said fourth transistor.

16. The method of providing an electronic biasing circuit according to claim 15, wherein said gate of said third transistor is arranged to provide a DC reference voltage level.

17. The method of providing an electronic biasing circuit according to claim 15, wherein said biasing circuit comprises a first set of n biasing cascode transistors, n being 1 or more, all drains of said first set of n biasing cascode transistors being interconnected and connected to said drain of said third transistor, all sources of said set of n biasing cascode transistors being interconnected and connected to a source of said third transistor, said gates of said first set of n biasing cascode transistors being arranged to receive a respective different one of a set of n control voltages, said biasing circuit comprising also a second set of n biasing cascode transistors, all drains of said second set of n biasing cascode transistors being interconnected and connected to said drain of said fourth transistor, all sources of said set of n biasing cascode transistors being interconnected and connected to a source of said fourth transistor, said gates of said second set of n biasing cascode transistors being arranged to receive a respective different one of said set of n control voltages.

18. The method of providing an electronic biasing circuit according to claim 15, wherein said resistor element is a variable resistor element.

19. The method of providing an electronic biasing circuit according to claim 15, wherein both said third transistor and said fourth transistor are diode connected, and have their gates connected to a power supply voltage.

20. The method of providing an electronic biasing circuit according to claim 15, further comprising a circuit to be biased by said electronic biasing circuit wherein
the circuit to be biased comprises a fifth transistor of said first MOSFET type and a sixth transistor of said first MOSFET type, said sixth transistor being connected in series with said fifth transistor, the circuit to be biased being connected to said DC bias voltage produced by said biasing circuit via an input circuit such that a gate of said fifth transistor receives a first DC voltage substantially equal to said DC bias voltage.

21. The method of providing an electronic biasing circuit according to claim 20, wherein a gate of said sixth transistor is arranged to receive a second DC voltage substantially equal to DC reference voltage level as present on said gate of said third transistor.

22. The method of providing an electronic biasing circuit according to claim 21, wherein said second DC voltage is derived from said DC reference voltage level via a voltage mirror circuit.

23. The method of providing an electronic biasing circuit according to claim 20, wherein said gate of said sixth transistor is connected to a drain of said sixth transistor via a load impedance having a DC impedance of substantially 0 Ohm.

24. The method of providing an electronic biasing circuit according to claim 20, wherein a source of said fifth transistor is connected to said supply reference voltage via a source impedance having a DC impedance of substantially 0 Ohm.

25. The method of providing an electronic biasing circuit according to claim 20, wherein said input circuit has an input to receive an AC input voltage to be supplied to said gate of said fifth transistor.

26. The method of providing an electronic biasing circuit according to claim 20, wherein said circuit to be biased comprises a third set of n cascode transistors, where n is 1 or more, all drains of said third set of n cascode transistors being interconnected and connected to said gate of said sixth transistor , all sources of said third set of n cascode transistors being interconnected and connected to a source of said sixth transistor, said gates of said third set of n cascode transistors being arranged to receive a respective different one of said set of n control voltages, said control voltages being derived from basic control voltages buffered by at least one digital gate which receives a power supply substantially equal to the second DC voltage.

27. The method of providing an electronic biasing circuit according to claim 26, wherein said circuit to be biased further comprises:
a seventh transistor of said first MOSFET type, and an eighth transistor of said first MOSFET type, said seventh transistor and eighth transistor being connected in series, a gate of said seventh transistor being arranged to receive said first DC voltage too,
a fourth set of n cascode transistors, all drains of said fourth set of n cascode transistors being interconnected and connected to said gate of said eighth transistor , all sources of said fourth set of n cascode transistors being interconnected and connected to a source of said eighth transistor, said gates of said fourth set of n cascode transistors being arranged to receive a respective different one of said set of n control voltages, said control voltages being derived from basic control voltages buffered by at least one digital gate which receives a power supply substantially equal to the second DC voltage.

28. The method of providing an electronic biasing circuit according to claim 20, wherein said circuit to be biased is an amplifier, such as a differential amplifier.

* * * * *